(12) United States Patent
Choi et al.

(10) Patent No.: US 9,575,386 B2
(45) Date of Patent: Feb. 21, 2017

(54) THIN FILM TRANSISTOR SUBSTRATE, METHOD OF MANUFACTURING THE SAME AND DISPLAY DEVICE HAVING THE SAME

(71) Applicant: Samsung Display Co., Ltd., Yongin, Gyeonggi-Do (KR)

(72) Inventors: Jin-Young Choi, Incheon (KR); Jae-Sung Kim, Gyeonggi-do (KR); Cha-Dong Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 412 days.

(21) Appl. No.: 13/961,714

(22) Filed: Aug. 7, 2013

(65) Prior Publication Data

US 2014/0211117 A1    Jul. 31, 2014

(30) Foreign Application Priority Data

Jan. 25, 2013  (KR) .................. 10-2013-0008689

(51) Int. Cl.
| | | |
|---|---|---|
| *G02F 1/1368* | (2006.01) | |
| *G02F 1/1345* | (2006.01) | |
| *H01L 27/12* | (2006.01) | |
| *G02F 1/1333* | (2006.01) | |

(52) U.S. Cl.
CPC ......... *G02F 1/1368* (2013.01); *G02F 1/13458* (2013.01); *H01L 27/124* (2013.01); *G02F 2001/133357* (2013.01); *G02F 2001/133388* (2013.01)

(58) Field of Classification Search
CPC ................ G02F 1/13458; G02F 2001/133357; G02F 2001/133388; G02F 1/133345; H01L 27/124
See application file for complete search history.

(56) References Cited

U.S. PATENT DOCUMENTS

| | | | | |
|---|---|---|---|---|
| 4,807,973 A | * | 2/1989 | Kawasaki ............. | G02F 1/1309 345/93 |
| 5,969,779 A | * | 10/1999 | Kim .................. | G02F 1/136204 349/143 |
| 6,429,908 B1 | * | 8/2002 | Lim ...................... | G02F 1/1309 349/192 |
| 6,930,742 B2 | * | 8/2005 | Lee ....................... | G02F 1/1339 349/143 |
| 7,154,217 B2 | | 12/2006 | Bae et al. | |

(Continued)

FOREIGN PATENT DOCUMENTS

| | | |
|---|---|---|
| KR | 1020060082627 | 7/2006 |
| KR | 1020060104673 | 10/2006 |

(Continued)

*Primary Examiner* — Dennis Y Kim
(74) *Attorney, Agent, or Firm* — Innovation Counsel LLP

(57) ABSTRACT

A thin film transistor substrate is provided. The thin film transistor substrate includes a display area including a plurality of pixels, wherein the pixels are connected to gate lines and data lines, a gate driver connected to the gate lines, a plurality of data pads connected to the data lines, a plurality of dummy pattern parts formed of a same layer as the gate lines, and a non-display area in which the gate driver, data pads, and dummy pattern parts are disposed, and the dummy pattern parts are disposed in an area within the non-display area where the gate driver is not disposed, and one of the dummy pattern parts is disposed overlapping with the data pads.

16 Claims, 9 Drawing Sheets

(56) References Cited

U.S. PATENT DOCUMENTS

| | | | |
|---|---|---|---|
| 7,948,594 B2 | 5/2011 | Ryu | |
| 7,999,901 B2 * | 8/2011 | Kang | G02F 1/1345 345/104 |
| 9,063,386 B2 * | 6/2015 | Ro | G02F 1/136286 |
| 2005/0162581 A1 * | 7/2005 | Lim | G02F 1/136259 349/54 |
| 2008/0170168 A1 | 7/2008 | Jung et al. | |
| 2010/0118250 A1 * | 5/2010 | Fujikawa | G02F 1/1345 349/139 |
| 2011/0186844 A1 | 8/2011 | Koo | |
| 2012/0092306 A1 * | 4/2012 | Liu | G09G 3/20 345/204 |
| 2012/0161131 A1 | 6/2012 | Kang et al. | |

FOREIGN PATENT DOCUMENTS

| | | |
|---|---|---|
| KR | 1020120022135 | 3/2012 |
| KR | 1020120066177 | 6/2012 |
| KR | 1020120075145 | 7/2012 |
| KR | 10-2014-0095820 | 8/2014 |

\* cited by examiner

THIN FILM TRANSISTOR SUBSTRATE, METHOD OF MANUFACTURING THE SAME AND DISPLAY DEVICE HAVING THE SAME

CROSS-REFERENCE TO RELATED APPLICATION

This U.S. non-provisional patent application claims priority under 35 U.S.C. §119 to Korean Patent Application No. 10-2013-0008689 filed on Jan. 25, 2013, the contents of which are hereby incorporated by reference.

BACKGROUND

1. Field of Disclosure

The present disclosure relates to a display device. More particularly, the present disclosure relates to a thin film transistor substrate for reducing bubbles generated in a non-display area of the display device, and a method of manufacturing the thin film transistor substrate.

2. Description of the Related Art

In recent years, various types of display devices have been developed. Examples of these display devices include liquid crystal display, organic light emitting display, electrowetting display, electrophoretic display, nano crystal display, and devices based on other types of display technologies.

In general, a display device includes a display area in which pixels are formed connected to gate lines and data lines are formed crossing the gate lines. The display device also includes a non-display area disposed in the vicinity of the display area.

Each pixel includes a thin film transistor. The thin film transistor is formed connected to a corresponding gate line and a corresponding data line. The thin film transistor receives a data voltage provided through the corresponding data line in response to a gate signal provided through the corresponding gate line. The pixel displays a gray scale corresponding to the data voltage provided to the thin film transistor.

During the manufacture of a display device, an annealing process is typically performed after the thin film transistors have been formed in the display area. The annealing process can remove defects in a semiconductor layer of the thin film transistors, and improve the electrical characteristics of the semiconductor layer.

SUMMARY

The present disclosure is directed to address at least the above problems relating to air bubbles generated via outgassing in the layers of a thin film transistor.

According to some embodiments of the inventive concept, a thin film transistor substrate is provided. The thin film transistor substrate includes a display area including a plurality of pixels, wherein the pixels are connected to gate lines and data lines, a gate driver connected to the gate lines, a plurality of data pads connected to the data lines, a plurality of dummy pattern parts formed of a same layer as the gate lines, and a non-display area in which the gate driver, data pads, and dummy pattern parts are disposed, and the dummy pattern parts are disposed in an area within the non-display area where the gate driver is not disposed, and one of the dummy pattern parts is disposed overlapping with the data pads.

In some embodiments, the non-display area may include a first non-display area disposed in a vicinity of the display area, wherein the gate driver, data pads, and dummy pattern parts are disposed in the first non-display area, and a second non-display area disposed in a vicinity of the first non-display area.

In some embodiments, the first non-display area may include a first dummy area disposed adjacent to a left side of the display area, wherein the gate driver is disposed in the first dummy area, a second dummy area disposed adjacent to an upper side of the display area, wherein the data pads are disposed in the second dummy area, a third dummy area disposed adjacent to a right side of the display area, and a fourth dummy area disposed adjacent to a lower side of the display area, wherein the dummy pattern parts are disposed in the second, third, and fourth dummy areas.

In some embodiments, the dummy pattern parts may include a first dummy pattern part disposed in the second dummy area, the first dummy pattern part overlapping with the data pads, a second dummy pattern part disposed in the third dummy area, and a third dummy pattern part disposed in the fourth dummy area.

In some embodiments, the display area may include a long side in a row direction and a short side in a column direction, the first and third dummy pattern parts being formed extending in the row direction beyond edges of the long side of the display area, the second dummy pattern part being formed extending in the column direction having a same length as the short side of the display area, and the second dummy pattern part does not overlap with the first and third dummy pattern parts when viewed from a plan view.

In some embodiments, each of the first, second, and third dummy pattern parts may include a plurality of dummy patterns, and the dummy patterns disposed on a same layer as the gate lines.

In some embodiments, the thin film transistor substrate may include a first base substrate, wherein the dummy patterns are disposed on the first base substrate, and a planarization layer disposed on the first base substrate in spaces between the dummy patterns, the planarization layer having a thickness that is less than a step difference, wherein the step difference is defined by a height difference between an upper surface of the first base substrate and an upper surface of the dummy patterns.

In some embodiments, each dummy pattern may have an area equal to or less than about 100 µm².

In some embodiments, each dummy pattern in the first and third dummy pattern parts may be formed extending in the column direction, having a short side in the row direction and a long side in the column direction, and spaced apart from adjacent dummy patterns by a first predetermined distance in the row direction, and each dummy pattern in the second dummy pattern part may be formed extending in the row direction, having a short side in the column direction and a long side in the row direction, and spaced apart from adjacent dummy patterns by a second predetermined distance in the column direction.

In some embodiments, the dummy patterns of at least one of the first, second, and third dummy pattern parts may be arranged in a plurality of rows or a plurality of columns, and each row or column may be spaced apart from adjacent rows or columns by a predetermined distance.

In some embodiments, the dummy patterns may include a plurality of first dummy patterns, and a plurality of second dummy patterns, each second dummy pattern having a size that is different than a size of each first dummy pattern, and the first and second dummy patterns may be alternately arranged in the row direction or the column direction.

According to some other embodiments of the inventive concept, a method of manufacturing a thin film transistor substrate is provided. The method includes forming gate lines on a display area of a first base substrate and forming a plurality of dummy patterns on a non-display area of the first base substrate, forming a planarization layer on the first base substrate, the planarization layer covering the gate lines and the dummy patterns, and removing an area of the planarization layer that is formed overlapping with the gate lines and the dummy patterns.

In some embodiments, the planarization layer may include a negative type photosensitive organic layer.

In some embodiments, removing of the area of the planarization layer may include irradiating light through a rear surface of the first base substrate to expose the planarization layer, wherein the planarization layer is exposed in an area where the gate lines and the dummy patterns are not formed, removing the area of the planarization layer that is formed overlapping with the gate lines and the dummy patterns, and curing the planarization layer.

In some embodiments, the method may include disposing a gate driver in the non-display area, wherein the gate driver is connected to the gate lines, forming data lines that are insulated from the gate lines, disposing data pads in the non-display area, wherein the data pads are connected to the data lines, and forming a plurality of thin film transistors in the display area, wherein each thin film transistor is connected to a corresponding gate line of the gate lines and a corresponding data line of the data lines.

In some embodiments, the non-display area may include a first non-display area disposed adjacent to the display area, and a second non-display area disposed adjacent to the first non-display area, the first non-display area comprising: a first dummy area disposed adjacent to a left side of the display area, wherein the gate driver is disposed in the first dummy area, a second dummy area disposed adjacent to an upper side of the display area, wherein the data pads are disposed in the second dummy area, a third dummy area disposed adjacent to a right side of the display area, and a fourth dummy area disposed adjacent to a lower side of the display area, wherein the first and third dummy areas are disposed extending in a column direction, the second and fourth dummy areas are disposed extending in a row direction, portions of both ends of the first and third dummy areas are disposed overlapping with portions of both ends of the second and fourth dummy areas, the dummy patterns are disposed in the second, third, and fourth dummy areas, and a predetermined number of the dummy patterns disposed in the second dummy area are disposed overlapping with the data pads.

In some embodiments, each dummy pattern in the second and fourth dummy areas may be formed extending in the column direction, having a short side in the row direction and a long side in the column direction, and spaced apart from adjacent dummy patterns by a first predetermined distance in the row direction, and each dummy pattern in the third dummy area may be formed extending in the row direction, having a short side in the column direction and a long side in the row direction, and spaced apart from adjacent dummy patterns by a second predetermined distance in the column direction.

In some embodiments, the dummy patterns of at least one of the second, third, and fourth dummy areas may be arranged in a plurality of rows or a plurality of columns, and each row or column may be spaced apart from adjacent rows or columns by a predetermined distance.

According to some further embodiments of the inventive concept, a display device is provided. The display device includes a thin film transistor substrate including a display area having a plurality of pixels and a non-display area disposed in a vicinity of the display area, wherein the pixels are connected to gate lines and data lines, a gate driver connected to the gate lines to apply gate signals to the pixels, a data driver connected to the data lines to apply data voltages to the pixels, a color filter substrate disposed facing the thin film transistor substrate, and a liquid crystal layer interposed between the thin film transistor substrate and the color filter substrate, the thin film transistor substrate further comprising: a plurality of data pads connected to the data lines and the data driver in the non-display area, and a plurality of dummy pattern parts disposed on a same layer as the gate lines, wherein the gate driver and the data pads are disposed in the non-display area, the dummy pattern parts are disposed in an area of the non-display area where the gate driver is not disposed, and one of the dummy pattern parts is disposed overlapping with the data pads.

BRIEF DESCRIPTION OF THE DRAWINGS

The above and other advantages of the present disclosure will be apparent with reference to the following detailed description and accompanying drawings.

DETAILED DESCRIPTION

Hereinafter, the present inventive concept will be explained in detail with reference to the accompanying drawings.

Figure 1:
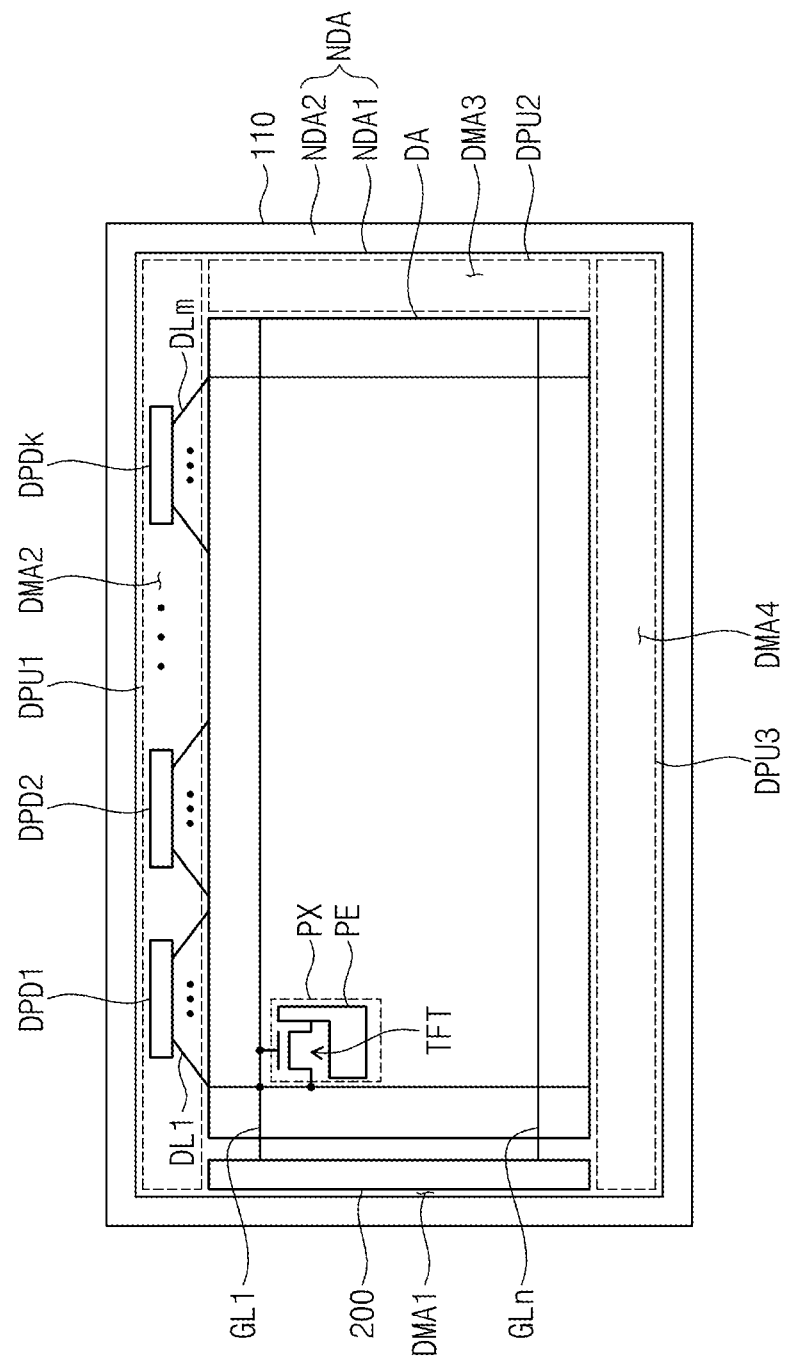
FIG. 1 is a plan view showing a thin film transistor substrate according to an exemplary embodiment of the present disclosure.

FIG. 1 is a plan view showing a thin film transistor substrate according to an exemplary embodiment of the present disclosure.

Referring to FIG. 1, a thin film transistor substrate 110 includes a plurality of gate lines GL1 to GLn, a plurality of data lines DL1 to DLm, a plurality of pixels PX, a plurality of data pads DPD1 to DPDk, and a plurality of dummy pattern parts DPU1, DPU2, and DPU3.

The thin film transistor substrate 110 includes a display area DA and a non-display area NDA. The non-display area NDA is disposed in a vicinity of the display area DA (when viewed from a plan view). The non-display area NDA includes a first non-display area NDA1 disposed in a vicinity of the display area DA, and a second non-display area NDA2 disposed in a vicinity of the first non-display area NDA1.

In the display area DA of the thin film transistor substrate 110, the gate lines GL1 to GLn are formed extending in a row direction, and the data lines DL1 to DLm are formed extending in a column direction that is substantially perpendicular to the row direction. The gate lines GL1 to GLn are formed crossing the data lines DL1 to DLm, and are insulated from the data lines DL1 to DLm by an intervening insulating layer. With reference to the data line DLm and gate line GLn, each of the subscripts "m" and "n" is an integer number that is greater than zero (0).

The pixels PX are disposed in the display area DA, and the areas of the pixels PX are defined by the gate lines GL1 to GLn crossing the data lines DL1 to DLm. The pixels PX are arranged in n rows by m columns. Each pixel PX is connected to a corresponding gate line of the gate lines GL1 to GLn and a corresponding data line of the data lines DL1 to DLm.

Each pixel PX includes a thin film transistor TFT and a pixel electrode PE connected to the thin film transistor TFT. The thin film transistor TFT includes a gate electrode connected to the corresponding gate line, a source electrode connected to the corresponding data line, and a drain electrode connected to the pixel electrode PE. The thin film transistor TFT switches on in response to a gate signal applied to the thin film transistor TFT through the corresponding gate line. A data voltage is also provided to the thin film transistor TFT through the corresponding data line. When the thin film transistor TFT is switched on, the thin film transistor TFT applies the data voltage to the pixel electrode PE.

Different elements are disposed in the first non-display area NDA1 of the thin film transistor substrate 110. These elements include a gate driver 200, data pads DPD1 to DPDk, and dummy pattern parts. The dummy pattern parts include a first dummy pattern part DPU1, second dummy pattern part DPU2, and third dummy pattern part DPU3. The dummy pattern parts are disposed in the first non-display area NDA1 except in an area where the gate driver 200 is disposed. In addition, one of the dummy pattern parts may be formed overlapping with the data pads. For example, as shown in FIG. 1, the first dummy pattern part DPU1 is formed overlapping with the data pads DPD1 to DPDk.

Referring to FIG. 1, the first non-display area NDA1 includes a first dummy area DMA1 disposed adjacent to a left side of the display area DA, a second dummy area DMA2 disposed adjacent to an upper side of the display area DA, a third dummy area DMA3 disposed adjacent to a right side of the display area DA, and a fourth dummy area DMA4 disposed adjacent to a lower side of the display area DA.

In the embodiment shown in FIG. 1, the first and third dummy areas DMA1 and DMA3 are formed extending in the column direction, and the second and fourth dummy areas DMA2 and DMA4 are formed extending in the row direction. In some embodiments, the end portions of the first and third dummy areas DMA1 and DMA3 may be formed overlapping with the end portions of the second and fourth dummy areas DMA2 and DMA4.

As mentioned above, the gate driver 200 is disposed in the first non-display area NDA1. Specifically, the gate driver 200 is disposed in the first dummy area DMA1, and provides gate signals to the pixels PX. In some embodiments, the gate driver 200 may include an amorphous silicon TFT gate driver circuit (ASG). The gate lines GL1 to GLn are formed extending into the first dummy area DMA1 and connected to the gate driver 200. The gate driver 200 applies the gate signals to the pixels PX through the gate lines GL1 to GLn. For example, the gate driver 200 may sequentially apply gate signals to the pixels PX row by row.

The data pads DPD1 to DPDk are disposed in the second dummy area DMA2. With reference to the data pad DPDk, the subscript "k" is an integer number that is greater than zero (0) and less than the value of subscript "m" (in data line DLm). The data lines DL1 to DLm are formed extending into the second dummy area DMA2 and connected to the data pads DPD1 to DPDk. Each of the data pads DPD1 to DPDk is connected to a predetermined number of data lines.

The data pads DPD1 to DPDk are connected to source driving chips (not shown). The source driving chips apply data voltages to the data pads DPD1 to DPDk. The data voltages are then applied to the pixels PX through the data lines DL1 to DLm connected to the data pads DPD1 to DPDk. An exemplary connection configuration between the source driving chips and data pads DPD1 to DPDk will be described later with reference to FIG. 8.

As mentioned previously, the dummy pattern parts include a first dummy pattern part DPU1, second dummy pattern part DPU2, and third dummy pattern part DPU3. As shown in FIG. 1, the first dummy pattern part DPU1 is disposed in the second dummy area DMA2 and overlaps with the data pads DPD1 to DPDk. The second dummy pattern part DPU2 is disposed in the third dummy area DMA3. The second dummy pattern part DPU2 is disposed in an area of the third dummy area DMA3 which does not overlap with the second and fourth dummy areas DMA2 and DMA4. The third dummy pattern part DPU3 is disposed in the fourth dummy area DMA4.

As shown in FIG. 1, a length of the display area DA is greater in the row direction than in the column direction. In other words, the display area DA has a long side in the row direction and a short side in the column direction.

Referring to FIG. 1, the first dummy pattern part DPU1 is formed extending in the row direction beyond the edges of the long side of the display area DA. The third dummy pattern part DPU3 is also formed extending in the row direction beyond the edges of the long side of the display area DA. In contrast, the second dummy pattern part DPU2 is formed extending in the column direction to the edges of the short side of the display area DA. For example, the second dummy pattern part DPU2 is formed extending in the column direction to a same length as the short side of the display area DA. As shown in FIG. 1, the second dummy pattern part DPU2 does not overlap with the first and third dummy pattern parts DPU1 and DPU3.

The first, second, and third dummy pattern parts DPU1, DPU2, and DPU3 are formed on the same layer as the gate lines GL1 to GLn, which will be described later with reference to FIG. 4.

In some embodiments, the thin film transistor substrate 110 can be mounted onto a chassis (not shown) to form a display device. The second non-display area NDA2 can, for example, provide an area for mounting the thin film transistor substrate 110 to the chassis.

Figure 2:
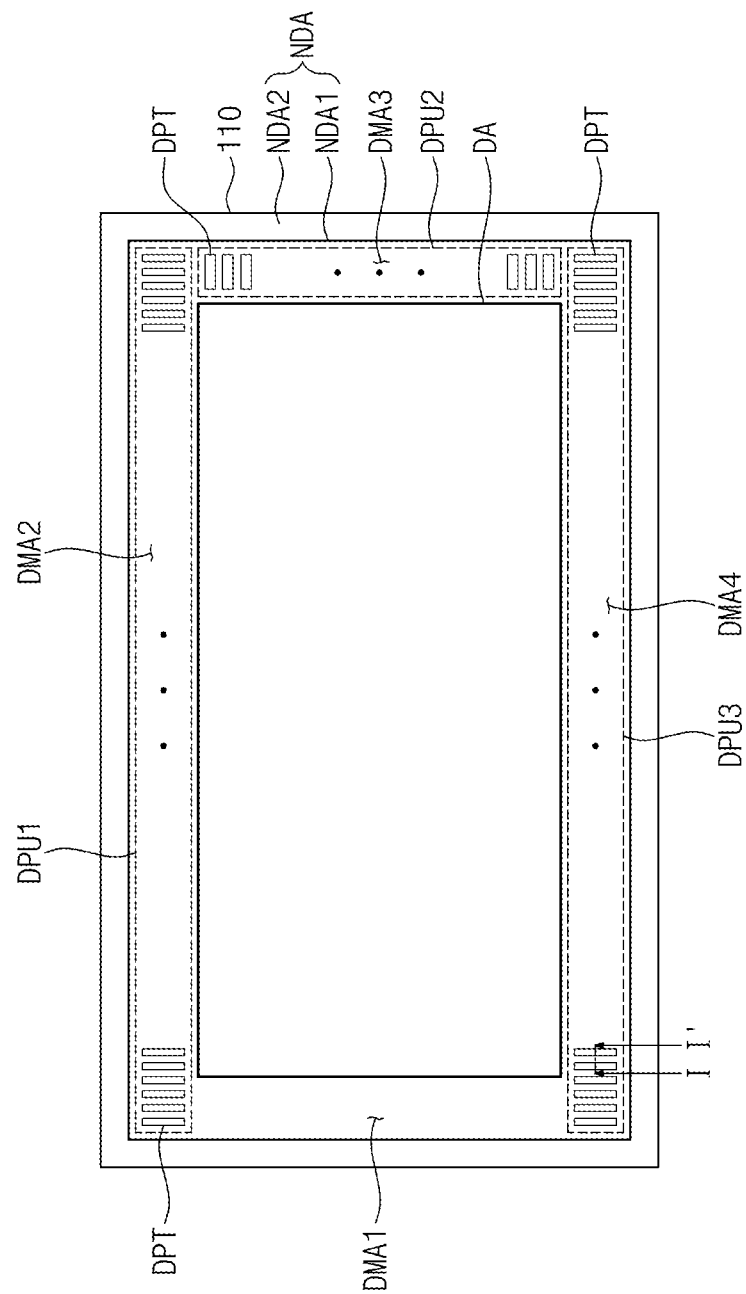
FIG. 2 is a plan view showing an exemplary configuration of the dummy pattern parts in the thin film transistor substrate of FIG. 1.

FIG. 2 is a plan view showing an exemplary configuration of the dummy pattern parts in the thin film transistor substrate of FIG. 1. In the interest of clarity, FIG. 2 focuses on illustrating the configuration of the dummy pattern parts.

Referring to FIG. 2, each of the first, second, and third dummy pattern parts DPU1, DPU2, and DPU3 includes a plurality of dummy patterns DPT. As shown in FIG. 2, each dummy pattern DPT may be formed having a rectangular shape. In some other embodiments, the dummy patterns DPT may be formed having other different shapes (such as a circular shape, triangular shape, or pentagonal shape).

In some embodiments, each dummy pattern DPT may have an area equal to or less than about 100 µm².

The dummy patterns DPT in the first and third dummy pattern parts DPU1 and DPU3 are formed elongated in the column direction (i.e., those dummy patterns DPT have a short side in the row direction and a long side in the column direction). The dummy patterns DPT in the first and third dummy pattern parts DPU1 and DPU3 are arranged in the row direction, with each dummy pattern DPT being spaced apart from adjacent dummy patterns DPT by a predetermined distance. As shown in FIG. 2, a predetermined number of the dummy patterns DPT in the first dummy pattern part DPU1 may be formed overlapping with the data pads DPD1 to DPDk.

The dummy patterns DPT in the second dummy pattern part DPU2 are formed elongated in the row direction (i.e., those dummy patterns DPT have a short side in the column direction and a long side in the row direction). The dummy patterns DPT in the second dummy pattern part DPU2 are arranged in the column direction, with each dummy pattern DPT being spaced apart from adjacent dummy patterns DPT by a predetermined distance.

Figure 3:
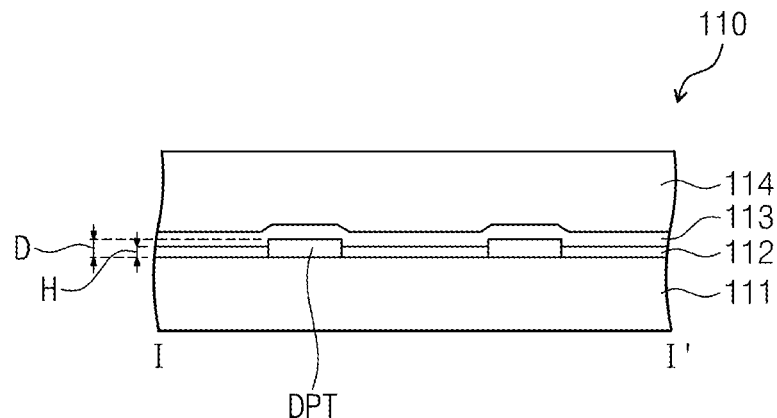
FIG. 3 is a cross-sectional view taken along line I-I' of the dummy patterns DPT shown in FIG. 2.

FIG. 3 is a cross-sectional view taken along line I-I' of the dummy patterns DPT shown in FIG. 2.

Referring to FIG. 3, the thin film transistor substrate 110 includes a first base substrate 111 and dummy patterns DPT disposed on the first base substrate 111. As previously described, the dummy patterns DPT are disposed in the second, third, and fourth dummy areas DMA2, DMA3, and DMA4 in the first non-display area NDA1. See, e.g., FIG. 2.

As shown in FIG. 3, a planarization layer 112 is disposed on the first base substrate 111 in the spaces between the dummy patterns DPT (in the areas within the first non-display area NDA1 where the dummy patterns DPT are not disposed). The planarization layer 112 can be used to reduce a step difference D between the first base substrate 111 and dummy patterns DPT. The step difference D is defined by a height difference between an upper surface of the first base substrate 111 and an upper surface of the dummy patterns DPT. The step difference D can also be defined by a thickness of the dummy patterns DPT. As shown in FIG. 3, the planarization layer 112 has a thickness H that is less than the step difference D.

As shown further in FIG. 3, a gate insulating layer 113 is formed covering the dummy patterns DPT and planarization layer 112. A protection layer 114 is also formed on the gate insulating layer 113.

Figure 4:
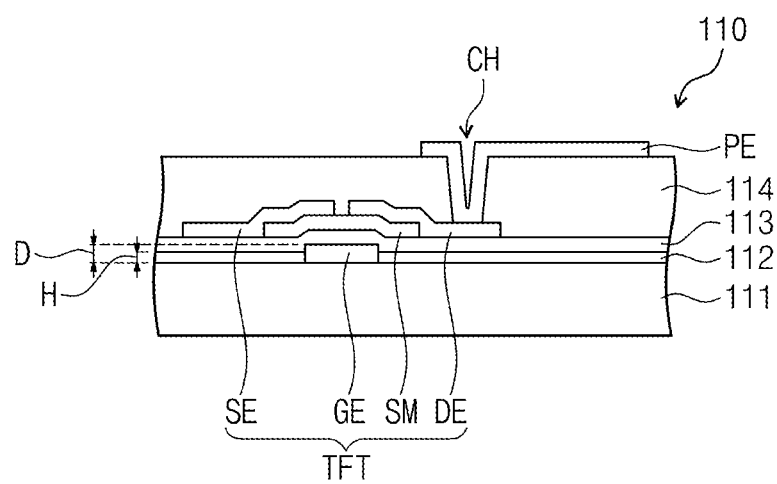
FIG. 4 is a cross-sectional view of the thin film transistor TFT in FIG. 1.

FIG. 4 is a cross-sectional view of the thin film transistor TFT in FIG. 1. Referring to FIG. 4, a gate electrode GE of the thin film transistor TFT is disposed on the first base substrate 111 in the display area DA. The gate electrode GE is connected to a corresponding gate line (not illustrated) and is formed branching out from the corresponding gate line.

The dummy patterns DPT in FIG. 3 and the gate electrode GE in FIG. 4 may be formed of a same layer, and may be simultaneously patterned from the same layer. Accordingly, the dummy patterns DPT and gate electrode GE may be formed of a same material.

Since the dummy patterns DPT and gate electrode GE may be formed of a same layer, the step difference D in FIG. 4 can be defined by a height difference between the upper surface of the first base substrate 111 and an upper surface of the gate electrode GE. In addition, the step difference D can be defined by a thickness of the gate electrode GE.

Referring to FIG. 4, the planarization layer 112 is disposed on the first base substrate 111 (in the areas within the display area DA where the gate electrode GE is not disposed). The planarization layer 112 can be used to reduce the step difference D between the first base substrate 111 and gate electrode GE. As shown in FIG. 4, the planarization layer 112 has a thickness H that is less than the step difference D.

As shown further in FIG. 4, the gate insulating layer 113 is disposed covering the gate electrode GE and planarization layer 112. A semiconductor layer SM of the thin film transistor TFT is disposed on the gate insulating layer 113 covering the gate electrode GE. The semiconductor layer SM is disposed covering a portion of the planarization layer 112 adjacent to the gate electrode GE.

The source electrode SE and drain electrode DE of the thin film transistor TFT are disposed on the semiconductor layer SM and gate insulating layer 113. As shown in FIG. 4, the source electrode SE and drain electrode DE are spaced apart from each other. The source electrode SE is connected to a corresponding data line (not shown) and formed branching out from the corresponding data line.

The data lines DL1 to DLm are arranged on the gate insulating layer 113 (not shown). Accordingly, the gate lines GL1 to GLn are insulated from the data lines DL1 to DLm by the intervening gate insulating layer 113.

Referring to FIG. 4, the semiconductor layer SM forms a conductive channel between the source electrode SE and drain electrode DE. A protection layer 114 is disposed covering the source electrode SE, drain electrode DE, conductive channel, and gate insulating layer 113. A contact hole CH is formed through the protection layer 114 to expose a portion of the drain electrode DE. A pixel electrode PE is disposed on a portion of the protection layer 114 and electrically connected to the drain electrode DE through the contact hole CH.

The gate lines GL1 to GLn are arranged on the first base substrate 111, and the planarization layer 112 is disposed on the first base substrate 111 between the gate lines GL1 to GLn (not shown). The dummy patterns DPT and gate lines GL1 to GLn may be formed of a same layer, and may be simultaneously patterned from the same layer. Accordingly, the dummy patterns DPT and gate lines GL1 to GLn may be formed of a same material.

Since the dummy patterns DPT and the gate lines GL1 to GLn may be formed of a same layer, the step difference D can be defined by a height difference between the upper surface of the first base substrate 111 and an upper surface of the gate lines GL1 to GLn. In addition, the step difference D can be defined by a thickness of the gate lines GL1 to GLn. The planarization layer 112 can be used to reduce the step difference D between the gate lines GL1 to GLn and first base substrate 111. The gate insulating layer 113 is disposed covering the gate lines GL1 to GLn and planarization layer 112.

An annealing process is typically performed after the thin film transistor TFT of FIG. 4 has been formed. As previously mentioned, the annealing process can remove defects in the semiconductor layer SM, and improve the electrical characteristics of the semiconductor layer SM.

However, the annealing process may result in air bubbles being generated in the planarization layer 112, as described below.

In a conventional device, the planarization layer 112 is disposed on the first base substrate 111 over the entire second, third, and fourth dummy areas DMA2, DMA3, and DMA4. The planarization layer 112 is typically formed of an organic material. Out-gassing in the organic material may occur when the organic material is subjected to high temperatures. For example, out-gassing in the planarization layer 112 (formed of an organic material) may occur during the annealing process and generate air bubbles in the planarization layer 112. Air bubbles are undesirable for the following reasons. For example, the air bubbles may result in the planarization layer 112 having a concave (or convex) portion, which reduces the surface flatness of the planarization layer 112. In addition, the air bubbles may lead to device reliability issues (e.g., short-circuits between adjacent conductive lines due to electromigration). Furthermore, the process chamber (in which the thin film transistors are manufactured) may be contaminated if the air bubbles burst during the annealing process or subsequent processing.

The amount of air bubbles generated in the planarization layer 112 can be reduced using the thin film transistor substrate 110 according to this inventive concept. Specifically, air bubbles can be reduced by using the dummy patterns DPT to decrease the areas (on the first non-display area NDA1) where the planarization layer 112 is formed.

As previously described, the dummy patterns DPT are first disposed on the first base substrate 111 in the second, third, and fourth dummy areas DMA2, DMA3, and DMA4 of the first non-display area NDA1 of the thin film transistor substrate 110. The planarization layer 112 is then disposed in the second, third, and fourth dummy areas DMA2, DMA3, and DMA4 (in the areas within the first non-display area NDA1 where the dummy patterns DPT are not disposed). Specifically, the planarization layer 112 is disposed on the first base substrate 111 in the spaces between the dummy patterns DPT. Thus, the dummy patterns DPT decrease the areas where the planarization layer 112 is formed in the second, third, and fourth dummy areas DMA2, DMA3, and DMA4 in the first non-display area NDA1. Accordingly, the amount of air bubbles in the planarization layer 112 after the annealing process can be reduced.

In addition to the dummy patterns DPT, other elements in the thin film transistor substrate 110 can decrease the areas where the planarization layer 112 is formed. For example, the gate driver 200 disposed in the first dummy area DMA1 of the first non-display area NDA1 may include a plurality of transistors (not shown). The planarization layer 112 is disposed on the first base substrate 111 in the first dummy area DMA1 (in the areas within the first non-display area NDA1 where the gate electrodes of the transistors are not disposed). Specifically, the planarization layer 112 is disposed on the first base substrate 111 in the spaces between those gate electrodes. Similar to the dummy patterns DPT, the gate electrodes decrease the areas where the planarization layer 112 is formed in the first non-display area NDA1. Accordingly, the amount of air bubbles in the planarization layer 112 after the annealing process can be further reduced.

Figure 5A:
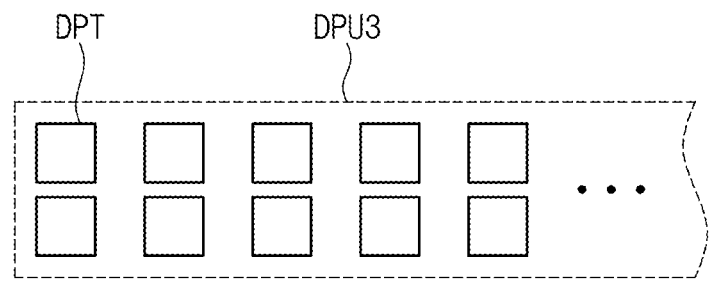
FIGS. 5A to 5C depict different embodiments of the dummy patterns shown in FIG. 2.
Figure 5B:
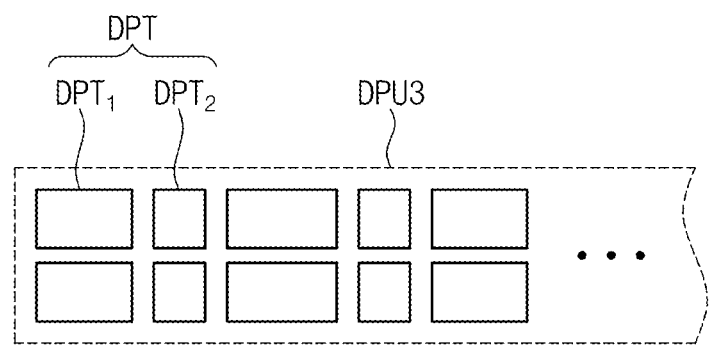
Figure 5C:
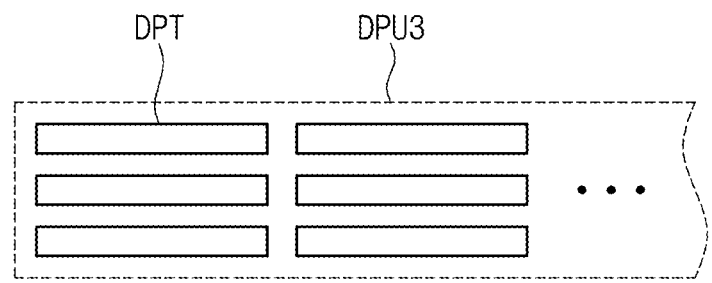

FIGS. 5A to 5C depict different embodiments of the dummy patterns shown in FIG. 2.

Although FIGS. 5A to 5C illustrate different configurations of the third dummy pattern part DPU3, it should be readily appreciated that the first and second dummy pattern parts DPU1 and DPU2 can also include those different configurations.

Referring to FIG. 5A, the dummy patterns DPT in the third dummy pattern part DPU3 are formed having a rectangular shape of a same size. The dummy patterns DPT can be arranged as a plurality of rows spaced apart from each other by a predetermined distance. For example, the dummy patterns DPT can be arranged in a grid form.

Referring to FIG. 5B, the dummy patterns DPT are formed having rectangular shapes of different sizes. The dummy patterns DPT in FIG. 5B can also be arranged as a plurality of rows spaced apart from each other by a predetermined distance. In some embodiments, the dummy patterns DPT may include a plurality of first dummy patterns $DPT_1$ and a plurality of second dummy patterns $DPT_2$ having a different size from the first dummy patterns $DPT_1$. For example, a size of the first dummy patterns $DPT_1$ may be greater than a size of the second dummy patterns $DPT_2$. In some embodiments, the first dummy patterns $DPT_1$ are alternately arranged with the second dummy patterns $DPT_2$ (in the row direction).

In FIGS. 5A and 5B, the dummy patterns DPT are depicted as being arranged in two rows. However, the arrangement of the dummy patterns DPT is not limited to the configurations as shown. For example, in some embodiments, the dummy patterns DPT may be arranged in more than two rows.

In some embodiments, the dummy patterns DPT in the first dummy pattern part DPU1 may have the same configuration as the dummy patterns DPT shown in FIG. 5A (or FIG. 5B). In some embodiments, the second dummy pattern part DPU2 may include the dummy patterns DPT shown in FIG. 5A (or FIG. 5B) arranged in a plurality of columns (instead of being arranged in rows).

Referring to FIG. 5C, the dummy patterns DPT are formed extending in the column direction, with each dummy pattern DPT having a long side in the row direction and a short side in the column direction. The dummy patterns DPT are arranged in rows and spaced apart from each other by a predetermined distance.

In the example of FIG. 5C, the dummy patterns DPT are arranged in three rows. Nevertheless, the arrangement of the dummy patterns DPT is not limited to the configuration as shown. For example, in some other embodiments, the dummy patterns DPT in FIG. 5C may be arranged in two rows, or more than three rows.

The first, second, and third dummy pattern parts DPU1, DPU2, and DPU3 may include one or more of the dummy patterns DPT shown in FIGS. 2, 5A, 5B, and 5C. For example, the first and third dummy pattern parts DPU1 and DPU3 may include the dummy patterns DPT shown in FIG. 2. The second dummy pattern part DPU2 may include dummy patterns DPT each having a long side in the column direction and a short side in the row direction, and the dummy patterns DPT may be arranged in rows that are spaced apart from each other by a predetermined distance. In some embodiments, the dummy patterns DPT shown in FIGS. 2, 5A, 5B, and 5C may be combined in different ways to form the first, second, and third dummy pattern parts DPU1, DPU2, and DPU3.

In some embodiments, a dummy pattern DPT (e.g., shown in FIGS. 5A, 5B, and 5C) may have an area equal to or less than about 100 $\mu m^2$.

FIGS. 6A to 6F and 7A to 7F are cross-sectional views showing the thin film transistor substrate 110 of FIG. 1 at different stages of fabrication according to an exemplary method of the present disclosure. Specifically, FIGS. 6A to 6F illustrate cross-sectional views of the dummy patterns DPT arranged in the first non-display area NDA1 of the thin film transistor substrate 110. Although FIGS. 6A to 6F depict a manufacturing method of two dummy patterns DPT, it should be readily appreciated that more than two dummy patterns DPT (and also other types of dummy patterns DPT) may be fabricated using the manufacturing method.

Figure 6A:
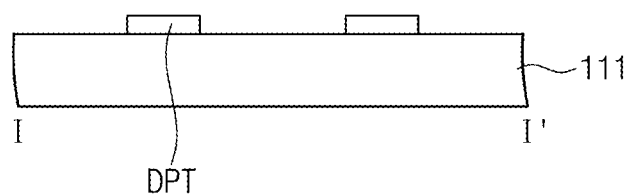
FIGS. 6A to 6F and 7A to 7F are cross-sectional views showing the thin film transistor substrate of FIG. 1 at different stages of fabrication according to an exemplary method of the present disclosure.

Referring to FIG. 6A, a first base substrate 111 is provided. The first base substrate 111 may be formed of a transparent material (e.g., glass). The area of the first base substrate 111 constitutes the area of the thin film transistor substrate 110 (when viewed from a plan view). Accordingly, the first base substrate 111 includes a display area DA and a non-display area NDA. The non-display area NDA includes a first non-display area NDA1 and second non-display area NDA2. The first non-display area NDA1 includes first to fourth dummy areas DMA1 to DMA4. The arrangement of the areas (e.g., display area DA, non-display area NDA, etc.) on the first base substrate 111 is the same as the arrangement shown in FIG. 1.

Dummy patterns DPT are formed on the first base substrate 111 in the second, third, and fourth dummy areas DMA2, DMA3, and DMA4 of the first non-display area NDA1. Since the arrangement of the dummy patterns DPT has been previously described, detailed description of the arrangement of the dummy patterns DPT shall be omitted.

Figure 6B:
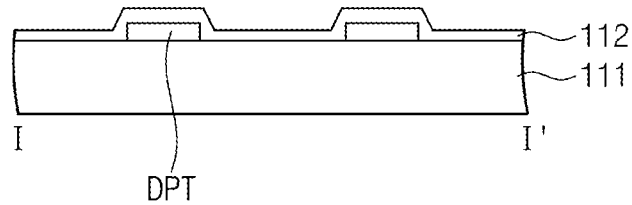

Referring to FIG. 6B, a planarization layer 112 is formed on the first base substrate 111 covering the dummy patterns DPT. The planarization layer 112 may be formed of a negative type photosensitive organic layer.

Figure 6C:
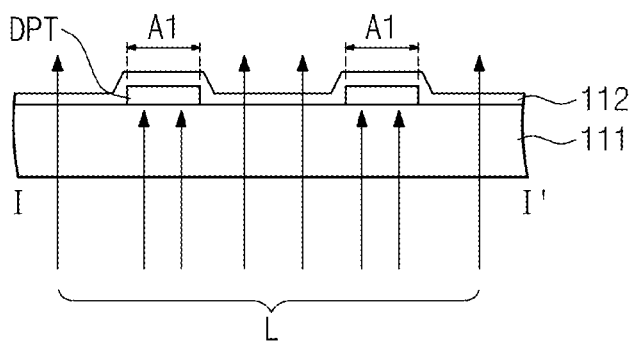

Referring to FIG. 6C, an exposure process is performed through a bottom surface of the first base substrate 111. Specifically, light L is irradiated onto the bottom surface of the first base substrate 111 (from below the first base substrate 111). The light L passes through the first base substrate 111 since the first base substrate 111 is formed of a transparent material. However, the light L is prevented from passing through the first base substrate 111 in the areas where the dummy (opaque) patterns DPT are located. As a result, the light L is not irradiated onto the first areas A1 of the planarization layer 112 (the first areas A1 correspond to areas where the planarization layer 112 overlaps with the dummy patterns DPT). Instead, the light L transmits through the planarization layer 112 in the areas where the dummy patterns DPT are not formed. Accordingly, the planarization layer 112 is exposed to the light L in the areas where dummy patterns DPT are not formed, and is not exposed to the light L in the first areas A1.

Figure 6D:
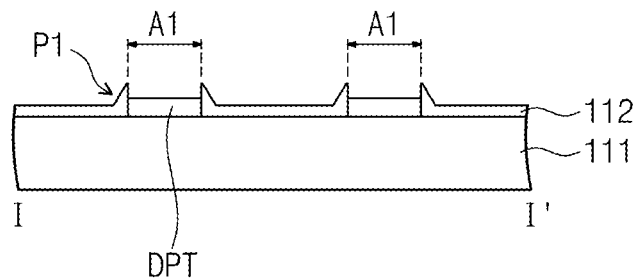

Referring to FIG. 6D, the exposed planarization layer 112 is developed using a developing solution. Depending on the tone (positive or negative) of the photosensitive organic layer used for the planarization layer 112, different portions of the exposed planarization layer 112 may be removed using the developing solution. For example, if the planarization layer 112 is formed of a negative type photosensitive organic layer, the first areas A1 of the planarization layer 112 (which are not exposed to the light L) will be removed by the developing solution. As further shown in FIG. 6D, a first protruding portion P1 of the planarization layer 112 is formed on the edges of the dummy patterns DPT after the first areas A1 of the planarization layer 112 have been removed.

Figure 6E:
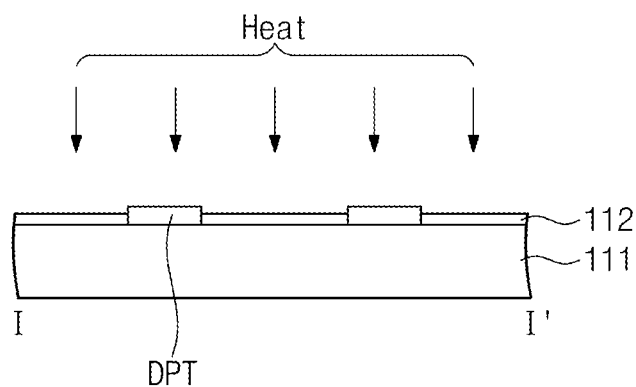
Figure 6F:
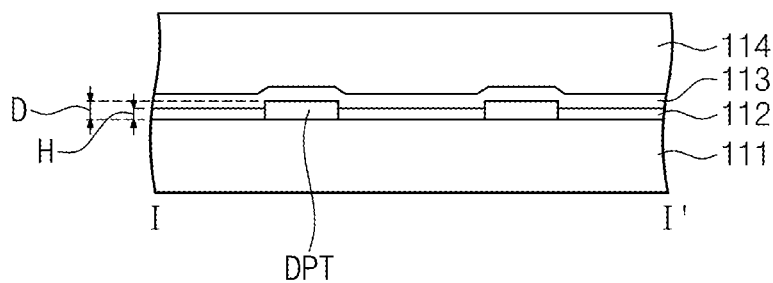

Referring to FIG. 6E, heat is applied in a thermal curing process to cure the developed planarization layer 112. In some embodiments, the planarization layer 112 is sufficiently heated, so as to melt the first protruding portions P1 of the planarization layer 112. After the thermal curing process, the cured planarization layer 112 remains on the first base substrate 111 in the areas between the dummy patterns DPT (i.e., in the areas where the dummy patterns DPT are not disposed). Referring to FIG. 6F, a gate insulating layer 113 is formed covering the dummy patterns DPT and the cured planarization layer 112. Next, a protection layer 114 is formed on the gate insulating layer 113.

FIGS. 7A to 7F are cross-sectional views showing a thin film transistor TFT (disposed in the display area DA of the thin film transistor substrate 110 of FIG. 1) at different stages of fabrication. Although FIGS. 7A to 7F show the manufacturing method of one type of thin film transistor TFT, it should be readily appreciated that other types of thin film transistors TFT may be fabricated using the same manufacturing method.

Figure 7A:
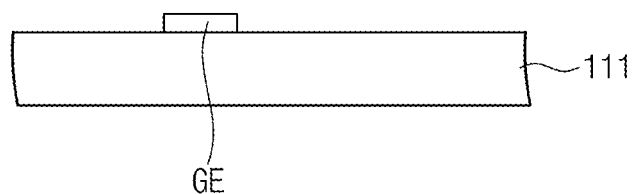

Referring to FIG. 7A, a gate electrode GE is formed on a first base substrate 111. As previously described, the gate electrode GE is formed branching out from a corresponding gate line (not shown).

Figure 7B:
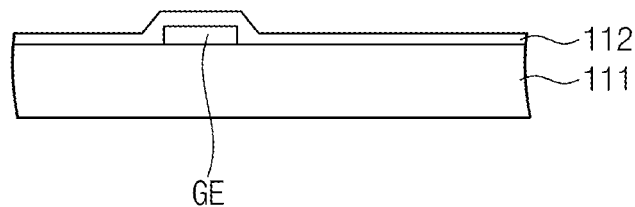

Referring to FIG. 7B, a planarization layer 112 is formed on the first base substrate 111 covering the gate electrode GE. The planarization layer 112 may be formed of a negative type photosensitive organic layer.

Figure 7C:
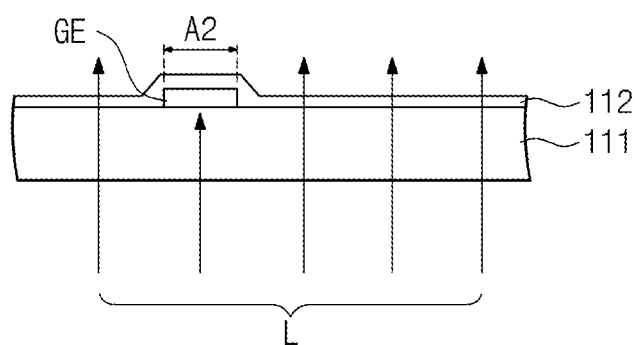

Referring to FIG. 7C, an exposure process is performed through a bottom surface of the first base substrate 111. Specifically, light L is irradiated onto the bottom surface of the first base substrate 111 (from below the first base substrate 111). The light L passes through the first base substrate 111 since the first base substrate 111 is formed of a transparent material. However, the light L is prevented from passing through the first base substrate 111 in the areas where the (opaque) gate electrode GE is located. As a result, the light L is not irradiated onto the second area A2 of the planarization layer 112 (the second area A2 corresponds to an area where the planarization layer 112 overlaps with the gate electrode GE). Instead, the light L transmits through the planarization layer 112 in the areas where the gate electrode GE is not formed. Accordingly, the planarization layer 112 is exposed to the light L in the areas where the gate electrode GE is not formed, and is not exposed to the light L in the second area A2.

Figure 7D:
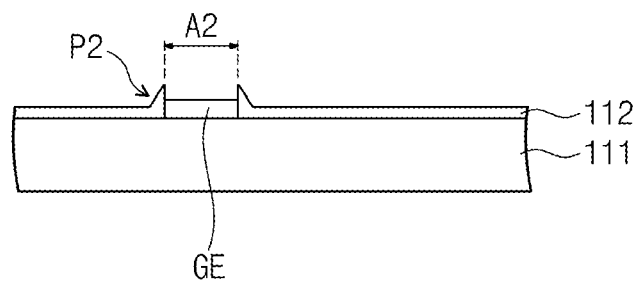

Referring to FIG. 7D, the exposed planarization layer 112 is developed using a developing solution. Depending on the tone (positive or negative) of the photosensitive organic layer used for the planarization layer 112, different portions of the exposed planarization layer 112 may be removed using the developing solution. For example, if the planarization layer 112 is formed of a negative type photosensitive organic layer, the second area A2 of the planarization layer 112 (which is not exposed to the light L) will be removed by the developing solution. As further shown in FIG. 7D, a second protruding portion P2 of the planarization layer 112 is formed on the edges of the gate electrode GE after the second area A2 of the planarization layer 112 has been removed.

Figure 7E:
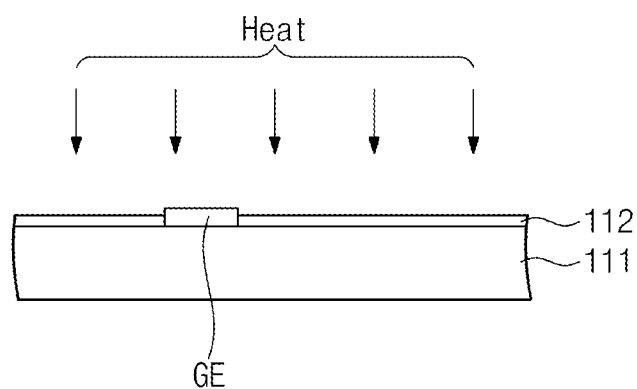

Referring to FIG. 7E, heat is applied in a thermal curing process to cure the developed planarization layer 112. In some embodiments, the developed planarization layer 112 is sufficiently heated, so as to melt the second protruding portion P2 of the planarization layer 112. After the thermal curing process, the cured planarization layer 112 remains on the first base substrate 111 in the areas where the gate electrode GE is not formed.

It should be readily appreciated that the method of forming the planarization layer 112 between the gate lines GL1 to GLn may be substantially the same as the method of forming the planarization layer 112 between the gate electrodes GE.

Figure 7F:
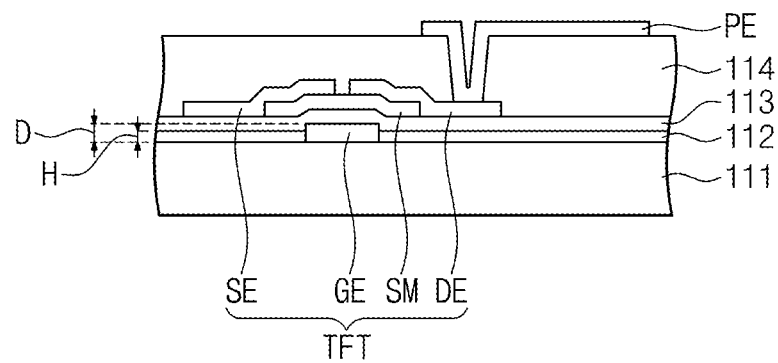

Referring to FIG. 7F, a gate insulating layer 113 is formed covering the gate electrode GE and planarization layer 112. A semiconductor layer SM is formed on the gate insulating layer 113 covering the gate electrode GE and a predetermined area of the planarization layer 112 adjacent to the gate electrode GE.

A source electrode SE and a drain electrode DE of the thin film transistor TFT are formed on the semiconductor layer SM and the gate insulating layer 113, with the source electrode SE and drain electrode DE spaced apart from each other. A protection layer 114 is formed covering the source electrode SE, drain electrode DE, conductive channel, and gate insulating layer 113. A contact hole CH is formed through the protection layer 114 to expose a portion of the drain electrode DE. A pixel electrode PE is formed on a portion of the protection layer 114 and is electrically connected to the drain electrode DE through the contact hole CH.

Accordingly, the thin film transistors TFT of the thin film transistor substrate 110 are formed in the display area DA using the above-described method in FIGS. 7A to 7F. An annealing process is typically performed after the thin film transistors TFT have been formed. As mentioned previously, the annealing process can remove the defects of the semiconductor layer SM and improve the electrical characteristics of the semiconductor layer SM.

As previously described, the dummy patterns DPT are first formed on the first base substrate 111 in the second, third, and fourth dummy areas DMA2, DMA3, and DMA4 of the first non-display area NDA1 of the thin film transistor substrate 110. The planarization layer 112 is then disposed in the second, third, and fourth dummy areas DMA2, DMA3, and DMA4, in the areas within the first non-display area NDA1 where the dummy patterns DPT are not disposed. Specifically, the planarization layer 112 is disposed on the first base substrate 111 in the spaces between the dummy patterns DPT. Thus, the dummy patterns DPT decrease the areas where the planarization layer 112 is formed in the second, third, and fourth dummy areas DMA2, DMA3, and DMA4 in the first non-display area NDA1. Accordingly, the amount of air bubbles in the planarization layer 112 after the annealing process can be reduced using the thin film transistor substrate 110.

Figure 8:
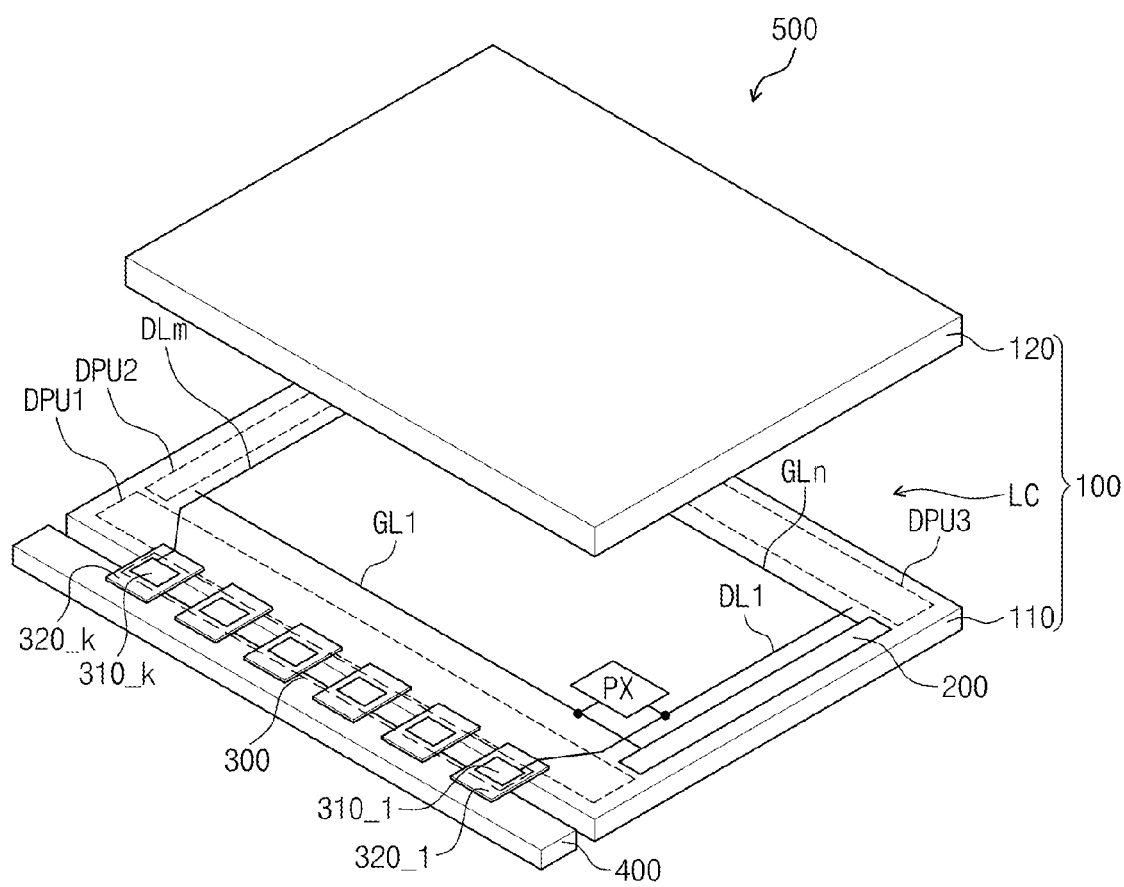
FIG. 8 is a perspective view showing a display device including the thin film transistor substrate of FIG. 1.

FIG. 8 is a perspective view showing a display device including the thin film transistor substrate 110 of FIG. 1.

In the interest of clarity, FIG. 8 depicts one pixel PX. Nevertheless, it should be understood that the display device includes a plurality of pixels PX, and the areas of the pixels PX are defined by the gate lines GL1 to GLn crossing the data lines DL1 to DLm.

Referring to FIG. 8, a display device 500 includes a display panel 100, gate driver 200, data driver 300, and driving circuit board 400.

The display panel 100 includes a thin film transistor substrate 110 on which the pixels PX are disposed, a color filter substrate 120 including a common electrode (not shown), the color filter substrate 120 being disposed facing the thin film transistor substrate 110, and a liquid crystal layer LC interposed between the thin film transistor substrate 110 and color filter substrate 120. Each pixel PX is connected to a corresponding gate line of the gate lines GL1 to GLn and a corresponding data line of the data lines DL1 to DLm.

Each pixel PX includes a pixel electrode PE and a thin film transistor TFT connected to the pixel electrode PE. The thin film transistor TFT receives a data voltage through the corresponding data line in response to a gate signal provided through the corresponding gate line. The thin film transistor TFT then applies the data voltage to the pixel electrode PE.

The gate driver 200 generates gate signals in response to a gate control signal provided from a timing controller (not shown) mounted on the driving circuit substrate 400. The gate signals are sequentially applied to the pixels PX row by row. Accordingly, the pixels PX are driven row by row.

The data driver 300 receives image signals and a data control signal from the timing controller. The data driver 300 generates analog data voltages corresponding to the image signals in response to the data control signal. The data driver 300 applies the data voltages to the pixels PX through the data lines DL1 to DLm. The data driver 300 includes the source driving chips 310_1 to 310_k. The source driving chips 310_1 to 310_k are respectively mounted on flexible circuit boards 320_1 to 320_k, and are connected to the driving circuit board 400 and the data pads DPD1 to DPDk in the first non-display area NDA1 shown in FIG. 1.

In some embodiments, the flexible circuit boards 320_1 to 320_k, on which the source driving chips 310_1 to 310_k are respectively mounted, are respectively connected to the data pads DPD1 to DPDk using anisotropic conductive films (not shown).

In the embodiment of FIG. 8, the source driving chips 310_1 to 310_k are mounted on the flexible circuit board 320_1 to 320_k using a tape carrier package (TCP) method. In some other embodiments, the source driving chips 310_1 to 310_k may be mounted on the flexible circuit board 320_1 to 320_k using a chip on glass (COG) method.

The dummy pattern parts DPU1, DPU2, and DPU3 are arranged in the first non-display area NDA1 where the gate driver 200 is not disposed. In addition, one of the dummy pattern parts DPU1, DPU2, and DPU3 is formed overlapping with the data pads DPD1 to DPDk. Since the different configurations of the dummy pattern parts DPU1, DPU2, and DPU3 and the thin film transistor substrate 110 have been previously described, detailed descriptions of those configurations shall be omitted.

In some embodiments, color filters are disposed on the color filter substrate 120. The color filters can include a color pixel displaying a red color, a green color, or a blue color. In some embodiments, the display device 500 includes a backlight unit disposed at a rear side of the display panel 100 to provide light to the display panel 110. The backlight unit may, for example, include a direct illumination backlight unit disposed under the display panel 100 to provide light to the display panel 100. In some other embodiments, the backlight unit may include an edge illumination backlight unit disposed at a rear side portion of the display panel 100 to provide light to the display panel 100.

When the data voltages are applied to the pixel electrodes PE by the thin film transistors TFT and a common voltage is applied to the common electrode, the alignment of liquid crystal molecules of the liquid crystal layer LC changes under the influence of the electric field generated by the voltages. The transmittance of light (generated from the backlight unit) passing through the liquid crystal layer LC is controlled based on the change in alignment of the liquid crystal molecules.

In the display device 500 of FIG. 8, the dummy patterns DPT are disposed on the first base substrate 111 in the second, third, and fourth dummy areas DMA2, DMA3, and DMA4 of the first non-display area NDA1. The planarization layer 112 is not formed over the entire area of the second, third, and fourth dummy areas DMA2, DMA3, and DMA4 of the first non-display area NDA1. Instead, the planarization layer 112 is formed on the first base substrate 111 in the spaces between the dummy patterns DPT, as previously described. Thus, the dummy patterns DPT decrease the areas where the planarization layer 112 is formed in the second, third, and fourth dummy areas DMA2, DMA3, and DMA4 in the first non-display area NDA1. Accordingly, the amount of air bubbles in the planarization layer 112 after the annealing process can be reduced in the display device 500 of FIG. 8.

Although the thin film transistor substrate 110 of this inventive concept has been described with reference to a liquid crystal display, it should be readily appreciated that the thin film transistor substrate 110 can also be used in other types of display devices (e.g., electrowetting display device, electrophoretic display device, or organic light emitting display device). Those other types of display devices can include a display area in which pixels are formed and a non-display area disposed in the vicinity of the display area. A driver for driving the pixels may be disposed in the non-display area, and the driver may include a gate driver and a data driver. Similar to the configuration of the above-described thin film transistor substrate 110, each of the electrowetting display device, electrophoretic display device, and organic light emitting display device may include dummy patterns DPT disposed in the non-display area and a planarization layer 112 disposed in the spaces between the dummy patterns DPT. By decreasing the area of the planarization layer 112 on the thin film transistor substrate 110, bubble generation in the planarization layer 112 can be reduced. Accordingly, the amount of air bubbles in the planarization layer 112 after the annealing process can also be reduced in the other types of display devices.

Although certain exemplary embodiments of the present disclosure have been described, it is understood that the present disclosure is not be limited to the described embodiments. Instead, various changes and modifications can be made by one of ordinary skill in the art within the spirit and scope of the present disclosure.

What is claimed is:

1. A thin film transistor substrate comprising:
    a base substrate;
    a display area including a plurality of pixels, wherein the pixels are connected to gate lines and data lines;
    a gate driver connected to the gate lines;
    a plurality of data pads connected to the data lines;
    a plurality of dummy pattern parts disposed on the base substrate and comprising a plurality of dummy patterns spaced apart by a predetermined distance and electrically isolated from each other and formed of a same layer as the gate lines;
    a planarization layer disposed on the base substrate in spaces between adjacent dummy patterns; and
    a non-display area in which the gate driver, data pads, and dummy pattern parts are disposed,
    wherein the dummy pattern parts are disposed in an area within the non-display area where the gate driver is not disposed, and one of the dummy pattern parts is disposed overlapping with the data pads, and
    wherein the planarization layer has a thickness that is less than a step difference, wherein the step difference is defined by a height difference between an upper surface of the base substrate and an upper surface of the dummy patterns.

2. The thin film transistor substrate of claim 1, wherein the non-display area comprises:
    a first non-display area disposed in a vicinity of the display area, wherein the gate driver, data pads, and dummy pattern parts are disposed in the first non-display area; and
    a second non-display area disposed in a vicinity of the first non-display area.

3. The thin film transistor substrate of claim 2, wherein the first non-display area comprises:
    a first dummy area disposed adjacent to a left side of the display area, wherein the gate driver is disposed in the first dummy area;
    a second dummy area disposed adjacent to an upper side of the display area, wherein the data pads are disposed in the second dummy area;
    a third dummy area disposed adjacent to a right side of the display area; and
    a fourth dummy area disposed adjacent to a lower side of the display area,
    wherein the dummy pattern parts are disposed in the second, third, and fourth dummy areas.

4. The thin film transistor substrate of claim 3, wherein the dummy pattern parts comprise:
    a first dummy pattern part disposed in the second dummy area, the first dummy pattern part overlapping with the data pads;
    a second dummy pattern part disposed in the third dummy area; and
    a third dummy pattern part disposed in the fourth dummy area.

5. The thin film transistor substrate of claim 4, wherein the display area includes a long side in a row direction and a short side in a column direction,
    the first and third dummy pattern parts being formed extending in the row direction beyond edges of the long side of the display area,
    the second dummy pattern part being formed extending in the column direction having a same length as the short side of the display area, and
    the second dummy pattern part does not overlap with the first and third dummy pattern parts when viewed from a plan view.

6. The thin film transistor substrate of claim 4, wherein each of the first, second, and third dummy pattern parts comprises a plurality of dummy patterns, and the dummy patterns are disposed on a same layer as the gate lines.

7. The thin film transistor substrate of claim 6, wherein each dummy pattern has an area equal to or less than about 100 $\mu m^2$.

8. The thin film transistor substrate of claim 6, wherein each dummy pattern in the first and third dummy pattern parts is formed extending in the column direction, having a short side in the row direction and a long side in the column direction, and spaced apart from adjacent dummy patterns by a first predetermined distance in the row direction, and
    each dummy pattern in the second dummy pattern part is formed extending in the row direction, having a short side in the column direction and a long side in the row direction, and spaced apart from adjacent dummy patterns by a second predetermined distance in the column direction.

9. The thin film transistor substrate of claim 6, wherein the dummy patterns of at least one of the first, second, and third dummy pattern parts are arranged in a plurality of rows or a plurality of columns, and each row or column is spaced apart from adjacent rows or columns by a predetermined distance.

10. The thin film transistor substrate of claim 9, wherein the dummy patterns comprise:
    a plurality of first dummy patterns; and
    a plurality of second dummy patterns, each second dummy pattern having a size that is different than a size of each first dummy pattern, and
    the first and second dummy patterns are alternately arranged in the row direction or the column direction.

11. A display device comprising:
    a thin film transistor substrate including a display area having a plurality of pixels and a non-display area disposed in a vicinity of the display area, wherein the pixels are connected to gate lines and data lines;

a gate driver connected to the gate lines to apply gate signals to the pixels;

a data driver connected to the data lines to apply data voltages to the pixels;

a color filter substrate disposed facing the thin film transistor substrate; and a liquid crystal layer interposed between the thin film transistor substrate and the color filter substrate, the thin film transistor substrate further comprising:

a base substrate;

a plurality of data pads connected to the data lines and the data driver in the non-display area;

a plurality of dummy pattern parts comprising a plurality of dummy patterns spaced apart by a predetermined distance and electrically isolated from each other and disposed on a same layer as the gate lines; and a planarization layer disposed on the base substrate in spaces between adjacent dummy patterns, wherein the gate driver and the data pads are disposed in the non-display area, the dummy pattern parts are disposed in an areas of the non-display area where the gate driver is not disposed, and one of the dummy pattern parts is disposed overlapping with the data pads, and wherein the planarization layer has a thickness that is less than a step difference, wherein the step difference is defined by a height difference between an upper surface of the base substrate and an upper surface of the dummy patterns.

12. The display device of claim 11, wherein the non-display area comprises:

a first non-display area disposed in a vicinity of the display area; and a second non-display area disposed in a vicinity of the first non-display area, the first non-display area comprises:

a first dummy area disposed adjacent to a left side of the display area, wherein the gate driver is disposed in the first dummy area;

a second dummy area disposed adjacent to an upper side of the display area, wherein the data pads are disposed in the second dummy area;

a third dummy area disposed adjacent to a right side of the display area; and a fourth dummy area disposed adjacent to a lower side of the display area, wherein the dummy pattern parts are disposed in the second, third, and fourth dummy areas.

13. The display device of claim 12, wherein the dummy pattern parts comprise:

a first dummy pattern part disposed in the second dummy area, the first dummy pattern part overlapping with the data pads;

a second dummy pattern part disposed in the third dummy area; and a third dummy pattern part disposed in the fourth dummy area, wherein the display area includes a long side in a row direction and a short side in a column direction, and the first and third dummy pattern parts being formed extending in the row direction beyond edges of the long side of the display area, the second dummy pattern part being formed extending in the column direction having a same length as the short side of the display area, and the second dummy pattern part does not overlap with the first and third dummy pattern parts when viewed from a plan view.

14. The display device of claim 13, wherein each of the first, second, and third dummy pattern parts comprises a plurality of dummy patterns, and the dummy patterns are disposed on a same layer as the gate lines, and each dummy pattern has an area equal to or less than about 100 $\mu m^2$.

15. The display device of claim 14, wherein each dummy pattern in the first and third dummy pattern parts is formed extending in the column direction, having a short side in the row direction and a long side in the column direction, and spaced apart from adjacent dummy patterns by a first predetermined distance in the row direction, and each dummy pattern in the second dummy pattern part is formed extending in the row direction, having a short side in the column direction and a long side in the row direction, and spaced apart from adjacent dummy patterns by a second predetermined distance in the column direction.

16. The display device of claim 14, wherein the dummy patterns of at least one of the first, second, and third dummy pattern parts are arranged in a plurality of rows or a plurality of columns, and each row or column is spaced apart from adjacent rows or columns by a predetermined distance.

* * * * *